United States Patent
Hsu et al.

(10) Patent No.: US 11,778,752 B2
(45) Date of Patent: Oct. 3, 2023

(54) CIRCUIT BOARD WITH EMBEDDED ELECTRONIC COMPONENT AND METHOD FOR MANUFACTURING THE SAME

(71) Applicants: Avary Holding (Shenzhen) Co., Limited., Shenzhen (CN); HongQiSheng Precision Electronics (QinHuangDao) Co., Ltd., Qinhuangdao (CN)

(72) Inventors: Hsiao-Ting Hsu, New Taipei (TW); Ming-Jaan Ho, New Taipei (TW); Fu-Yun Shen, Shenzhen (CN)

(73) Assignees: Avary Holding (Shenzhen) Co., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 245 days.

(21) Appl. No.: 17/418,551

(22) PCT Filed: Jan. 21, 2020

(86) PCT No.: PCT/CN2020/073428
§ 371 (c)(1),
(2) Date: Jun. 25, 2021

(87) PCT Pub. No.: WO2021/146894
PCT Pub. Date: Jul. 29, 2021

(65) Prior Publication Data
US 2022/0312598 A1    Sep. 29, 2022

(51) Int. Cl.
*H05K 1/02* (2006.01)
*H05K 3/30* (2006.01)
(Continued)

(52) U.S. Cl.
CPC ......... *H05K 3/306* (2013.01); *H05K 1/0353* (2013.01); *H05K 1/092* (2013.01); *H05K 1/185* (2013.01);
(Continued)

(58) Field of Classification Search
CPC ...... H05K 1/02; H05K 1/0271; H05K 1/0298; H05K 1/0353; H05K 1/0366;
(Continued)

(56) References Cited

U.S. PATENT DOCUMENTS

| | | | |
|---|---|---|---|
| 2002/0135058 A1* | 9/2002 | Asahi | H05K 1/187 257/788 |
| 2002/0192442 A1* | 12/2002 | Kondo | H05K 3/4617 428/209 |

(Continued)

FOREIGN PATENT DOCUMENTS

| | | |
|---|---|---|
| CN | 101027775 A | 8/2007 |
| CN | 102256450 A | 11/2011 |

*Primary Examiner* — Xiaoliang Chen
(74) *Attorney, Agent, or Firm* — ScienBiziP, P.C.

(57) ABSTRACT

A method for manufacturing a circuit board (100) includes: providing a first single-sided circuit substrate (20) including an insulating base layer (11) and a circuit layer (13); forming first conductive posts (111) electrically connected to the circuit layer (13) in the insulating base layer (11) to obtain a second single-sided circuit substrate (13); providing a first adhesive layer (40), forming second conductive posts (401); providing one second single-sided circuit substrate (30), defining a receiving groove (31) to obtain a third single-sided circuit substrate (50); providing another first single-sided circuit substrate (20), mounting an electronic component (14) on the circuit layer (13) to obtain a surface mounted circuit substrate (60); stacking the first single-sided circuit substrate (20), the first adhesive layer (40), the second single-sided circuit substrate (30), at least one of the (Continued)

third single-sided circuit substrate (50), and the surface mounted circuit substrate (60) in that order; pressing the intermediate body (70).

10 Claims, 10 Drawing Sheets

(51) Int. Cl.
*H05K 1/03* (2006.01)
*H05K 1/09* (2006.01)
*H05K 1/18* (2006.01)

(52) U.S. Cl.
CPC ............... *H05K 2201/0141* (2013.01); *H05K 2201/0145* (2013.01)

(58) Field of Classification Search
CPC .... H05K 1/0373; H05K 1/0393; H05K 1/115; H05K 1/181; H05K 1/182; H05K 1/185; H05K 1/186; H05K 1/188; H05K 1/189; H05K 3/0017; H05K 3/0044; H05K 3/0097; H05K 3/30; H05K 3/301; H05K 3/306; H05K 3/429; H05K 3/4617; H05K 3/4632; H05K 3/4647; H05K 3/4652; H05K 3/4682; H05K 3/4691; H05K 3/4697; H05K 2201/0133; H05K 2201/0141; H05K 2201/0145; H05K 2201/10378; H05K 2201/10636
USPC ........ 361/761, 760, 762, 764; 174/257, 258, 174/260, 264; 29/830, 832, 841
See application file for complete search history.

(56) References Cited

U.S. PATENT DOCUMENTS

| | | | | |
|---|---|---|---|---|
| 2003/0085058 A1* | 5/2003 | Komatsu | ............. | H05K 3/4069 174/257 |
| 2006/0005384 A1* | 1/2006 | Hung | ............. | H05K 1/188 29/830 |
| 2006/0063301 A1* | 3/2006 | Hung | ............. | H05K 1/185 438/106 |
| 2007/0164449 A1* | 7/2007 | Wang | ............. | H01L 25/16 257/E25.032 |
| 2007/0263369 A1* | 11/2007 | Takeuchi | ............. | H05K 1/186 361/760 |
| 2008/0007927 A1* | 1/2008 | Ito | ............. | H01L 24/82 361/764 |
| 2009/0008765 A1* | 1/2009 | Yamano | ............. | H01L 25/162 257/E23.125 |
| 2009/0025971 A1* | 1/2009 | Kanemaru | ............. | H05K 1/0271 29/841 |
| 2009/0041994 A1* | 2/2009 | Ockenfuss | ............. | H01L 24/82 428/209 |
| 2009/0260866 A1* | 10/2009 | Palm | ............. | H01L 21/6835 29/841 |
| 2010/0236698 A1* | 9/2010 | Sekimoto | ............. | H05K 3/4652 156/272.8 |
| 2011/0104858 A1* | 5/2011 | Katagiri | ............. | H01L 24/97 257/E21.51 |
| 2011/0141711 A1* | 6/2011 | Sohn | ............. | H01L 24/24 29/832 |
| 2011/0203107 A1* | 8/2011 | Schrittwieser | ............. | H01L 23/544 29/841 |
| 2013/0058055 A1* | 3/2013 | Yamamoto | ............. | H05K 3/284 174/257 |
| 2013/0219712 A1* | 8/2013 | Suzuki | ............. | H01L 24/19 29/841 |
| 2014/0151100 A1* | 6/2014 | Yu | ............. | H05K 1/185 174/258 |
| 2014/0321084 A1* | 10/2014 | Lee | ............. | H05K 1/185 361/761 |
| 2015/0223320 A1* | 8/2015 | Gerhauer | ............. | H01L 21/486 29/832 |
| 2015/0327362 A1* | 11/2015 | Maeda | ............. | H05K 3/4682 361/761 |
| 2015/0327369 A1* | 11/2015 | Seki | ............. | H05K 3/4652 156/60 |
| 2017/0339783 A1* | 11/2017 | Stahr | ............. | H01L 21/481 |
| 2017/0339784 A1* | 11/2017 | Zluc | ............. | H05K 1/0366 |
| 2018/0199438 A1* | 7/2018 | Tuominen | ............. | H01L 24/19 |
| 2018/0288879 A1* | 10/2018 | Tuominen | ............. | H05K 3/4697 |
| 2021/0183782 A1* | 6/2021 | Yasukawa | ......... | H01L 23/49838 |

* cited by examiner

CIRCUIT BOARD WITH EMBEDDED ELECTRONIC COMPONENT AND METHOD FOR MANUFACTURING THE SAME

FIELD

The disclosure relates to circuit boards, and more particularly, to a circuit board with an embedded electronic component and a method for manufacturing the circuit board.

BACKGROUND

In recent years, electronic products are widely used in daily life. Light weight, ultra-thin, and small in size are desirable properties in consumer electronic devices. As a main component of such an electronic device, a circuit board, occupies a large space of the electronic product. Therefore, a size of circuit board greatly affects an overall size of the electronic device. Large sized circuit boards may hinder the further developments of the electronic device towards light weight, very thin, and small sizes.

In order to reduce an overall thickness of the circuit board, electronic component (such as a resistor, a capacitor, etc.) of the circuit board may be embedded in a circuit substrate. However, after embedding the electronic component, multiple processes, such as pressing an outer circuit layer on the circuit substrate and forming a cover film on the outer circuit layer, may be necessary. The multiple processes may cause accumulation of defects, and damages to the electronic components. On the other hand, since the pressing processes need to be performed at a certain temperature, the circuit board may be deformed after multiple pressing processes. As such, quality of the circuit boards may be reduced.

SUMMARY

To overcome the above shortcomings, a circuit board with an embedded electronic component and a method for manufacturing the same, which can increase the quality and reduce the cost of the circuit board, are needed.

The present disclosure provides a method for manufacturing a circuit board, including:

providing a first single-sided circuit substrate, the first single-sided circuit substrate including an insulating base layer and a circuit layer disposed on the insulating base layer;

providing one of the first single-sided circuit substrate, forming a plurality of first conductive posts electrically connected to the circuit layer in the insulating base layer, thereby obtaining a second single-sided circuit substrate;

providing a first adhesive layer, forming a plurality of second conductive posts in the first adhesive layer;

providing one of the second single-sided circuit substrate, defining a receiving groove penetrating the circuit layer and the insulating base layer of the second single-sided circuit substrate, thereby obtaining a third single-sided circuit substrate;

providing another one of the first single-sided circuit substrate, and mounting an electronic component on the circuit layer, thereby obtaining a surface mounted circuit substrate;

stacking the first single-sided circuit substrate, the first adhesive layer containing the plurality of second conductive posts, the second single-sided circuit substrate, at least one of the third single-sided circuit substrate, and the surface mounted circuit substrate in that order, causing the receiving groove to correspond to the electronic component, and causing the first single-sided circuit substrate and the insulating base layer of the surface mounted circuit substrate to both face outwards, thereby obtaining an intermediate body; and pressing the intermediate body, causing the plurality of first conductive posts and the plurality of second conductive posts to electrically connected to both sides of the circuit layer, thereby obtaining the circuit board.

The present disclosure further provides a circuit board, including a first single-sided circuit substrate, a first adhesive layer, a second single-sided circuit substrate, at least one third single-sided circuit substrate, and a surface mounted circuit substrate stacked in that order;

wherein the first single-sided circuit substrate includes an insulating base layer and a circuit layer disposed on the insulating base layer;

wherein the second single-sided circuit substrate includes the first single-sided circuit substrate and a plurality of first conductive posts formed in the insulating base layer and electrically connected to the circuit layer;

wherein a plurality of second conductive posts is formed in the first adhesive layer;

wherein the third single-sided circuit substrate includes the second single-sided circuit substrate and a receiving groove defined in the second single-sided circuit substrate;

wherein the surface mounted circuit substrate includes the first single-sided circuit substrate and an electronic component mounted on the circuit layer, the first single-sided circuit substrate and the insulating base layer of the surface mounted circuit substrate are disposed at outermost of the circuit board;

wherein the electronic component is disposed in the receiving groove, and the plurality of first conductive posts and the plurality of second conductive posts are electrically connected to both sides of the circuit layers.

Compared to the existing technologies, since the entire method of the present disclosure includes only one pressing process, the deformation of the circuit board caused by multiple pressing processes is reduced. The defect rate is also reduced, the method is simplified, and the cost is also reduced.

SYMBOL DESCRIPTION OF MAIN COMPONENTS

Figure 1A:
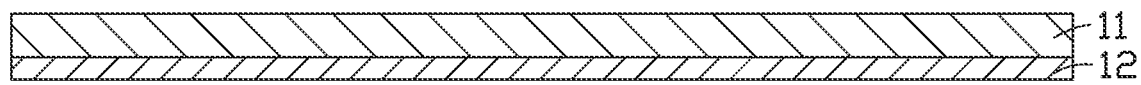
FIG. 1A is a cross-sectional view of a single-sided copper cladding substrate in a first embodiment according to the present disclosure.

Single-sided copper cladding substrate 10
Insulating base layer 11
Copper foil layer 12
Circuit layer 13
Electronic component 14
Second adhesive layer 15
First single-sided circuit substrate 20
Second single-sided circuit substrate 30, 30'
Receiving groove 31
First adhesive layer 40
Third single-sided circuit substrate 50, 50'
Surface mounted circuit board 60
Circuit board 100, 200
First opening 110
First end 110a
Second end 110b
First conductive post 111
First solder pad 130
Second solder pad 131
Protective layer 132
Conductive bump 140
Conductive layer 141
Second opening 400
Second conductive post 401

Many aspects of the disclosure may be better understood with reference to the following drawings.

DETAILED DESCRIPTION

Referring to FIGS. 1 to 8, a first embodiment of the present disclosure provides a method for manufacturing a circuit board 100, including following steps.

Step S1, referring to FIG. 1A, a single-sided copper cladding substrate 10 is provided. The single-sided copper cladding substrate 10 includes an insulating base layer 11 and a copper foil layer 12 disposed on a surface of the insulating base layer 10.

In the embodiment, the insulating base layer 11 is made of at least one thermoplastic polymer resin selected from a group consisting of thermoplastic polyimide (TPI), polyethylene terephthalate (PET), polyethylene naphthalate (PEN), Ajinnomoto Build-up Film (ABF), and bismaleimide triazine (BT).

A thickness of the insulating base layer 11 may be 25 microns to 125 microns. A thickness of the copper foil layer 12 may be 12 microns to 18 microns.

Figure 1B:
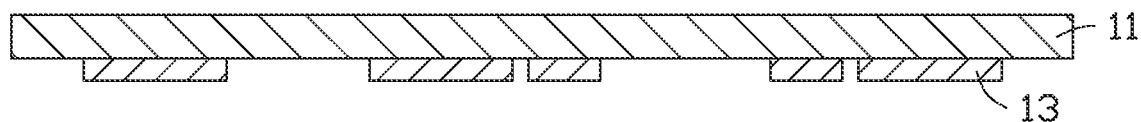
FIG. 1B is a cross-sectional view wherein the single-sided copper cladding substrate of FIG. 1A, is fabricated into a first single-sided circuit substrate.

Step S2, referring to FIG. 1B, the copper foil layer 12 is fabricated into a circuit layer 13. A first single-sided circuit substrate 20 is then obtained.

In the embodiment, a copper plating layer (not shown) may be plated on the copper foil layer 12. The circuit layer 13 may be formed by etching the copper plating layer and the copper foil layer 12 through an exposure and development process.

Figure 2:
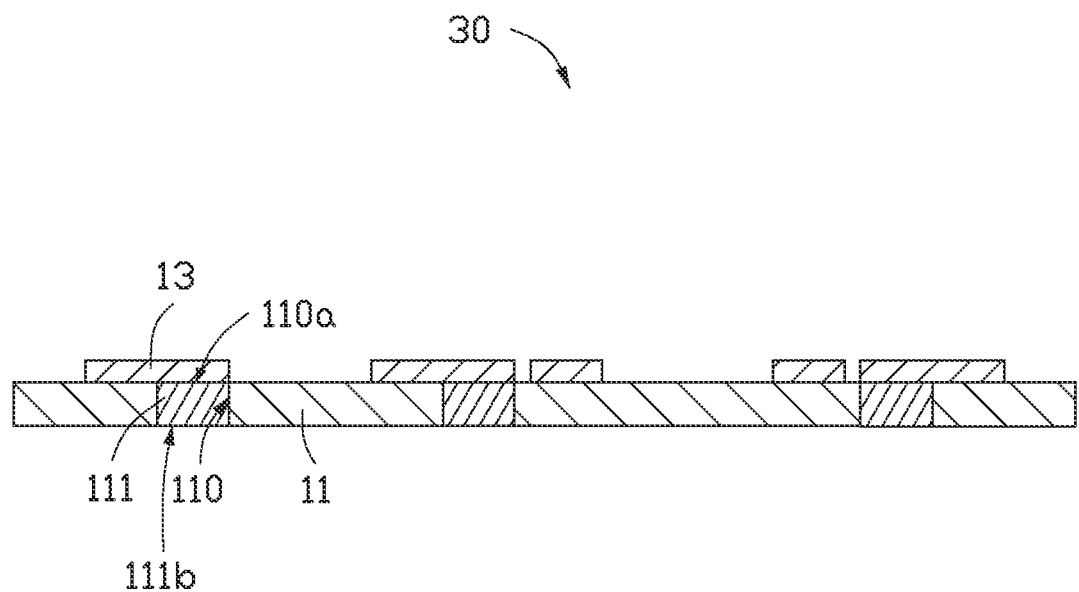
FIG. 2 is a cross-sectional view wherein the first single-sided circuit substrate of FIG. 1B, is fabricated into a second single-sided circuit substrate.

Step S3, referring to FIG. 2, such a first single-sided circuit substrate 20 is provided. A number of first openings 110 are defined in a region of the insulating base layer 11 corresponding to the circuit layer 13. A conductive material is filled in each of the first openings 110, thereby obtaining a number of first conductive posts 111 electrically connected to the circuit layer 13. Then, a second single-sided circuit substrate 30 is obtained.

In the embodiment, the conductive material may be a copper paste. A surface of the copper paste away from the circuit layer 13 may be substantially flushed with a surface of the insulating base layer 11.

The first openings 110 may be defined by laser or other mechanical means. The first opening 110 includes a first end 110a facing the circuit layer 13 and a second end 110b opposite to the first end 110a. When the first openings 110 are defined by laser, a width of the first end 110a is smaller than a width of the second end 110b.

Figure 3A:
FIG. 3A is a cross-sectional view of a first adhesive layer in a first embodiment according to the present disclosure.

Step S4, referring to FIG. 3A, a first adhesive layer 40 is provided.

In the embodiment, the first adhesive layer 40 may be made of an insulating and adhesive resin, such as at least one of epoxy resin, polypropylene, polyurethane, phenolic resin, urea-formaldehyde resin, melamine-formaldehyde resin, unsaturated resin, polyamide resin, etc.

Furthermore, a thickness of the first adhesive layer 40 may be 25 microns to 100 microns.

Figure 3B:
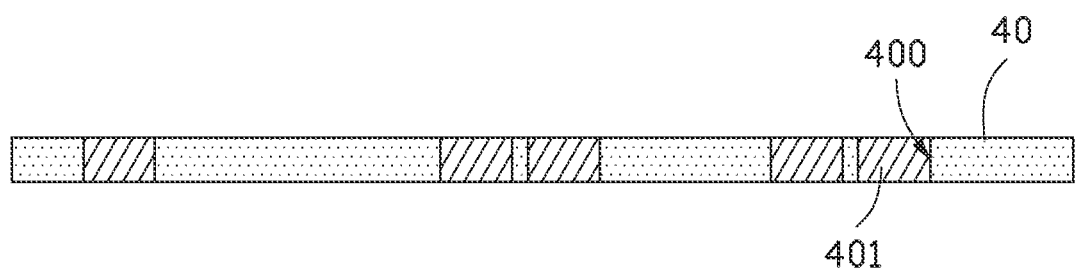
FIG. 3B is a cross-sectional view wherein a conductive post is formed in the first adhesive layer of FIG. 3A.

Step S5, referring to FIG. 3B, a plurality of second openings 400 are defined in the first adhesive layer 40. A conductive material is filled in each of the second openings 400, thereby obtaining a plurality of second conductive posts 401. In the embodiment, the conductive material may be a metal conductive paste, such as a copper paste, a solder paste, or a resin-based conductive paste.

In the embodiment, an average diameter of the second openings 400 is 100 microns to 150 microns.

Furthermore, as shown in FIG. 3B, the second openings 400 penetrate the first adhesive layer 40, that is, the second conductive posts 401 penetrate the first adhesive layer 40. The second openings 400 may be defined by laser or other mechanical means.

Figure 4:
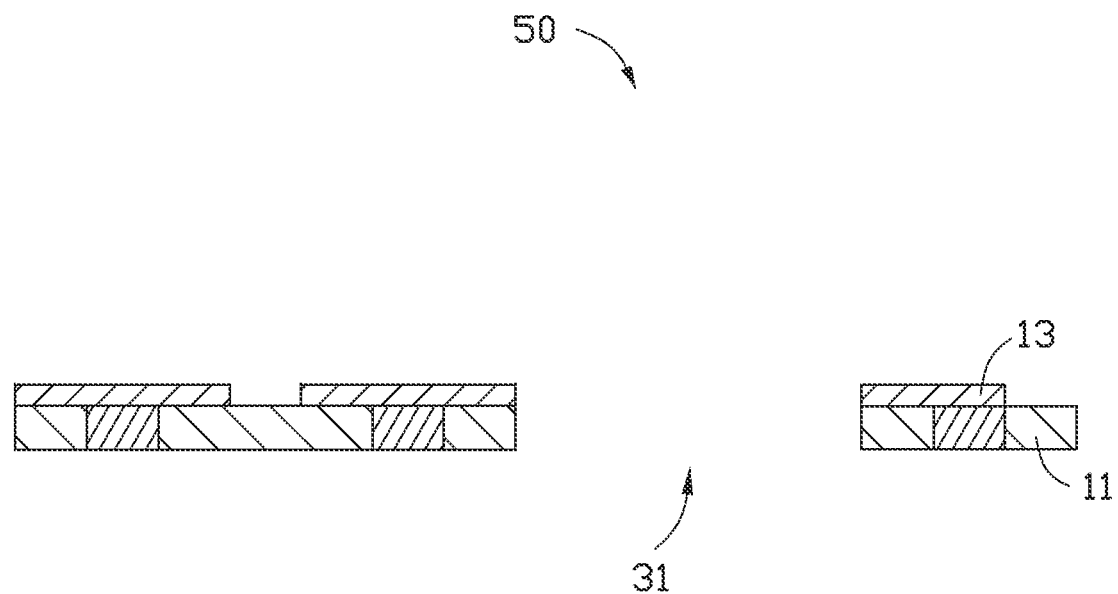
FIG. 4 is a cross-sectional view wherein the second single-sided circuit substrate of FIG. 2, is fabricated into a third single-sided circuit substrate.

Step S6, referring to FIG. 4, such a second single-sided circuit substrate 30 is provided. A receiving groove 31 is defined in the second single-sided circuit substrate 30, which penetrates through the circuit layer 13 and the insulating base layer 11. A third single-sided circuit substrate 50 is then obtained.

Figure 5:
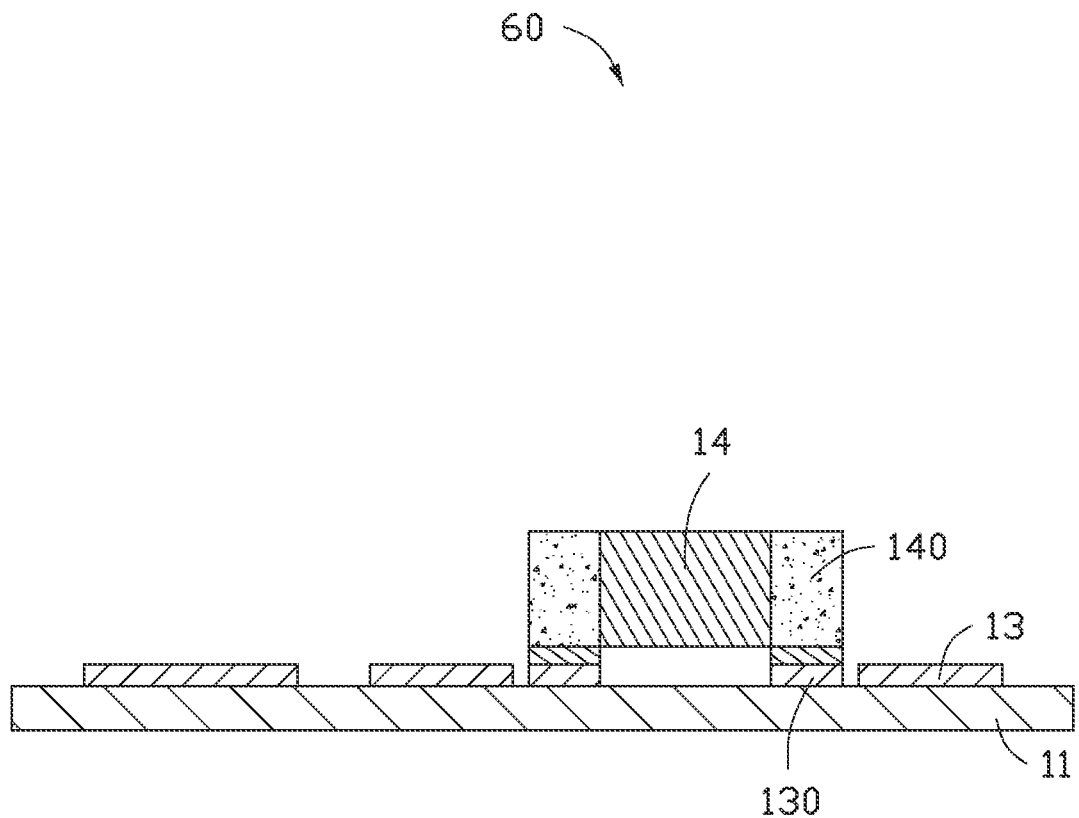
FIG. 5 is a cross-sectional view wherein the first single-sided circuit substrate of FIG. 1B, is fabricated into a surface mounted circuit substrate.

Step S7, referring to FIG. 5, another first single-sided circuit substrate 20 is provided. An electronic component 14 is mounted on the circuit layer 13 to obtain a surface mounted circuit substrate 60.

In the embodiment, the circuit layer 13 includes two first solder pads 130. The electronic component 14 may be mounted on the first solder pads 130 through a conductive layer 141. The conductive layer 141 may be made of a conductive material such as copper paste, solder paste, or wafer conductive adhesive, and has a thickness of 40 microns to 80 microns. A heat resistance or a melting point of the conductive layer 141 is higher than a pressing temperature in the subsequent step S9 (that is, a heating temperature allows the insulating base layer 11 to be plastic), so that the conductive material will not melt during the pressing process.

Furthermore, the electronic component 14 may be mounted on the first solder pads 130 through two conductive bumps 140 spaced from each other. The electronic component 14 is located between the two conductive bumps 140. A size of the conductive bump 140 may be 150 microns to 400 microns.

Furthermore, the electronic component 14 may be a passive component or an active component. The passive component includes resistor, capacitor, inductor, etc. The active component includes memory, LED drive IC, sensor components, etc.

Figure 6:
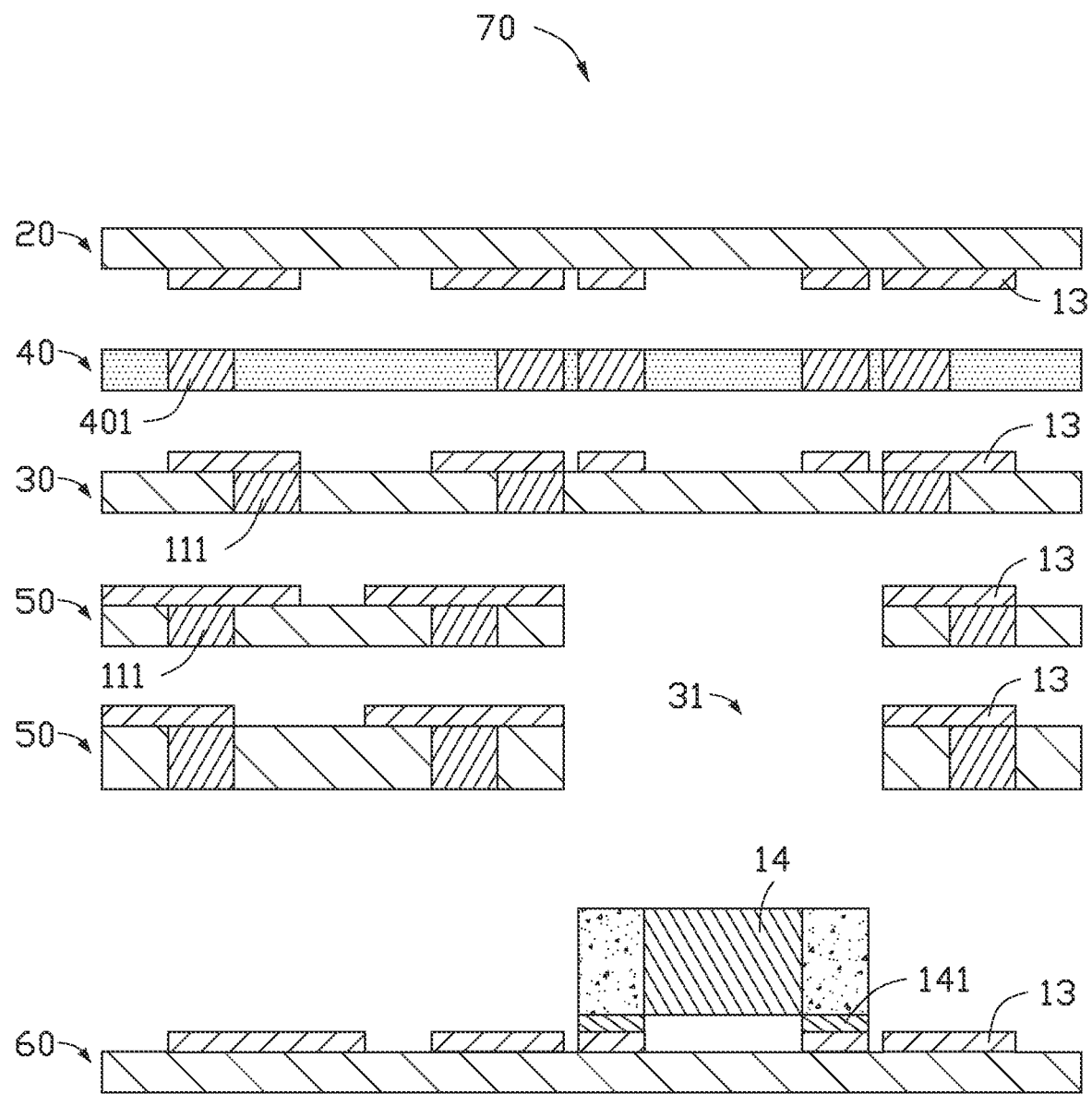
FIG. 6 is a cross-sectional view wherein the first single-sided circuit substrate of FIG. 1B the first adhesive layer of FIG. 3B, the second single-sided circuit substrate of FIG. 2, the third single-sided circuit substrate of FIG. 4, and the surface mounted circuit substrate of FIG. 5 are stacked to obtain an intermediate body.

Step S8, referring to FIG. 6, a first single-sided circuit substrate 20, a first adhesive layer 40 containing the second conductive posts 401, a second single-sided circuit substrate 30, at least one third single-sided circuit substrate 50, and the chi-mounted circuit substrate 60 are stacked together, so that the receiving groove 31 corresponds to the electronic component 14. Also, the insulating base layer 11 of the first single-sided circuit substrate 20 and the insulating base layer 11 of the surface mounted circuit board 60 both face outwards. An intermediate body 70 is thus obtained.

The second conductive posts 401 correspond to the circuit layers 13 disposed on both sides of the second conductive posts 401. The first conductive posts 111 of the second single-sided circuit substrate 30 correspond to the circuit layer 13 of the third single-sided circuit substrate 50. The first conductive posts 111 of the third single-sided circuit substrate 50 correspond to the circuit layer 13 of the surface mounted circuit substrate 60.

The third single-sided circuit substrate 50 functions as a build-up portion, and its number in the intermediate body 70 may be changed according to actual needs (e.g., according to the number of circuit layers required by the circuit board or according to the height of the electronic component 14). The embodiment shows that two third single-sided circuit substrates 50 are included. The thicknesses of the single-sided circuit substrates 50 may be the same or different from each other. The thickness of the single-sided circuit substrates 50 may also be adjusted according to the height of the electronic component 14.

Figure 7:
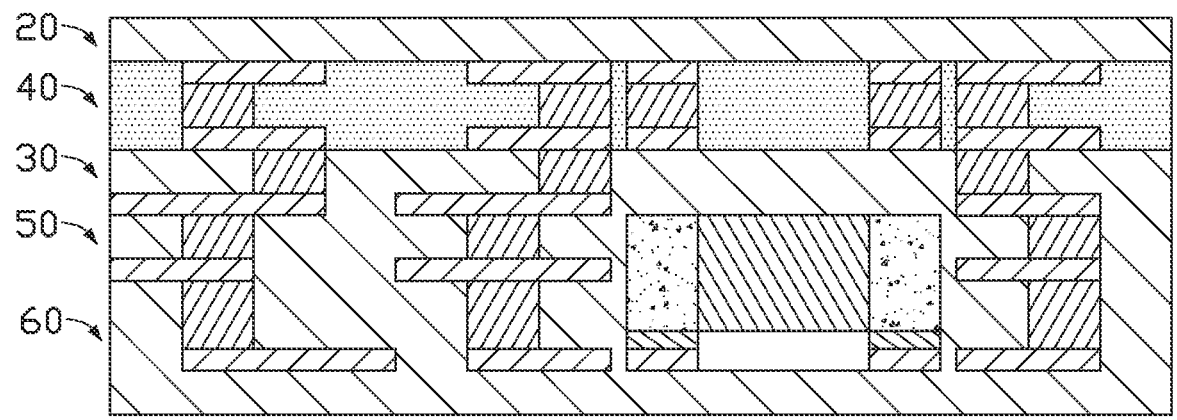
FIG. 7 is a cross-sectional view wherein the intermediate body is pressed.

Step S9, referring to FIG. 7, the intermediate body 70 is pressed, so that the first adhesive layer 40 of the intermediate body 70 infills the gap in the circuit layers 13, and the insulating base layer 11 infills the gap between the receiving groove 31 and the electronic component 14. Thus, the first single-sided circuit substrate 20, the first adhesive layer 40, the second single-sided circuit substrate 30, the third single-sided circuit substrate 50, and the surface mounted circuit substrate 60 are bonded together. Moreover, after the pressing, the first conductive posts 111 and the second conductive posts 401 are electrically connected to both sides of the circuit layers 13 to achieve electric conduction.

The pressing may be performed under a heating temperature, which is higher than the melting point of the first adhesive layer 40 and also allows the insulating base layer 11 to be plastic. Since the insulating base layer 11 is made of the thermoplastic polymer resin, the insulating base layer 11 has plasticity when heated, and can infill the gap during flowing.

Figure 8:
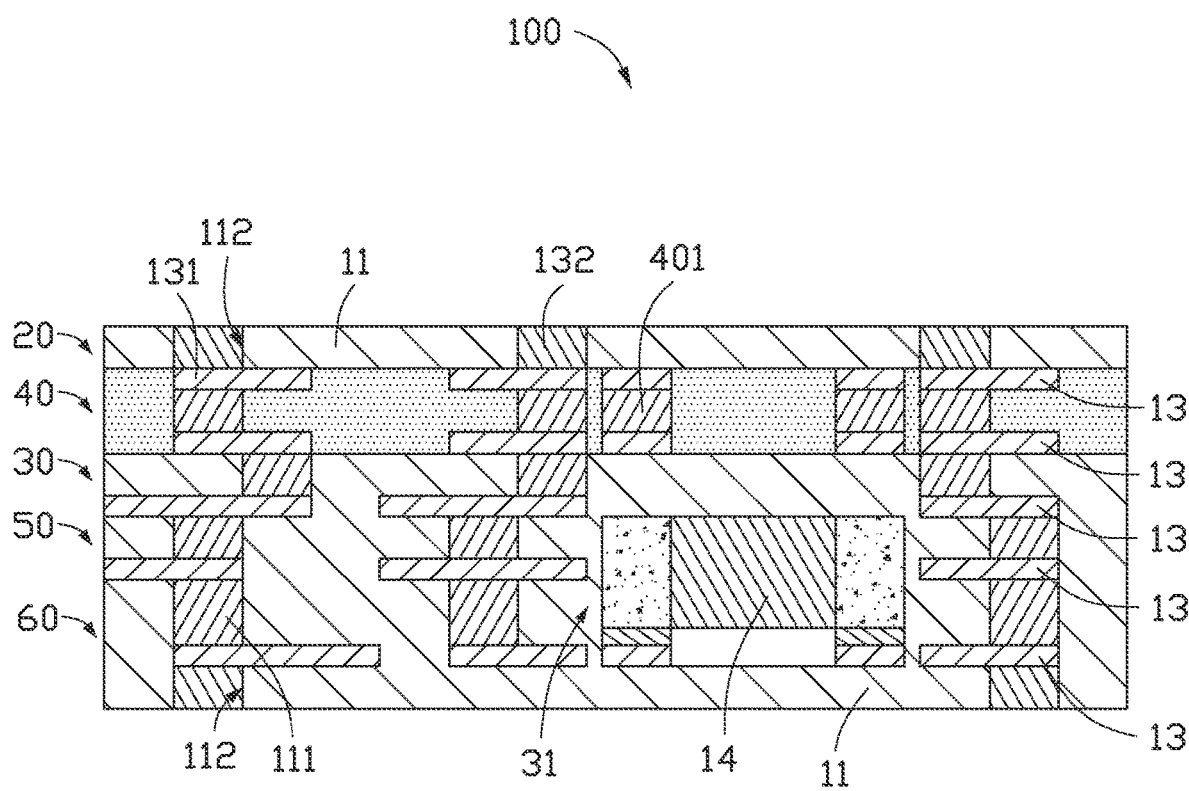
FIG. 8 is a cross-sectional view wherein a hole is defined in an insulating base layer disposed at outermost of the intermediate body of FIG. 7, and surface treatment is performed to obtain a circuit board.

Step S10, referring to FIG. 8, a number of third openings 112 are defined in each insulating base layer 11 of the intermediate body 70 after the pressing facing outwards. A portion of the circuit layer 13 is exposed from the third openings 112 to form a plurality of second solder pads 131. Then, surface treatment is performed on the second solder pads 131, to prevent surface of the second solder pads 131 from being oxidized that may affect the electrical characteristics. Thus, the circuit board 100 is obtained.

The surface treatment can form a protective layer 132 by electroless gold plating, electroless nickel plating, or the like. The protective layer 132 infills the third openings 112, which may be substantially flushed with the surface of the insulating base layer 11. In other embodiments, an organic solder resist protective layer (OSP, not shown) may also be disposed on the surface of the second solder pads 131.

The third openings 112 may be defined by laser or other mechanical means.

Figure 9:
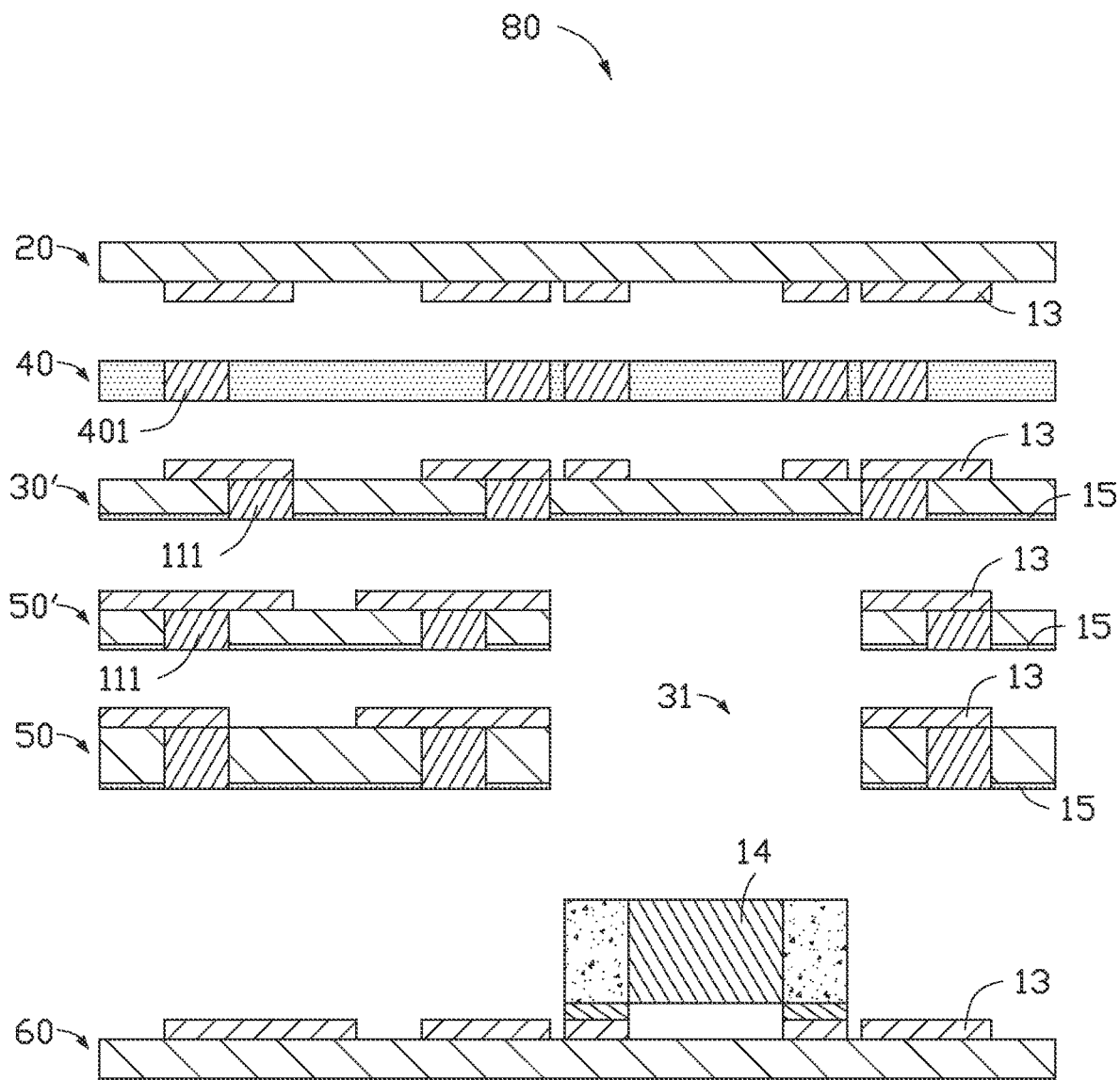
FIG. 9 is a cross-sectional view wherein the first single-sided circuit substrate, the first adhesive layer, the second single-sided circuit substrate, the third single-sided circuit substrate, and the surface mounted circuit substrate are stacked to obtain an intermediate body in a second embodiment.
Figure 10:
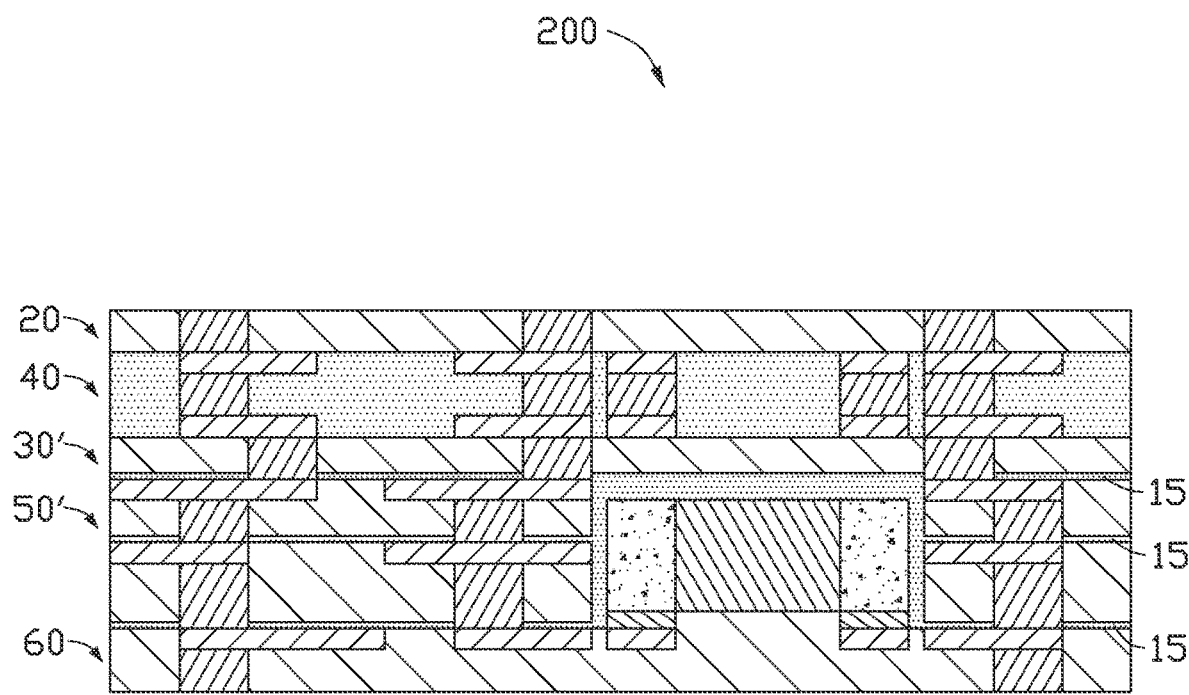
FIG. 10 is a cross-sectional view wherein a hole is defined in the intermediate body of FIG. 9, and surface treatment is performed to obtain a circuit board.

Referring to FIGS. 9 and 10, a second embodiment of the present disclosure also provides a method for manufacturing a circuit board 200. Differences from the first embodiment are that the insulating base layer 11 is made of a non-thermoplastic polymer resin. For example, the insulating base layer 11 may be made of liquid crystal polymer (LCP). Since the insulating base layer 11 is made of liquid crystal polymer, the pressing temperature is as high as 300 Celsius degrees, which makes it difficult to choose a material suitable for the conductive layer 141 that has higher heat resistance or higher melting point.

Therefore, in step S3 of fabricating the second single-sided circuit substrate 30 by the first single-sided circuit substrate 20, a second adhesive layer 15 can be first disposed on the surface of the insulating base layer 11 away from the circuit layer 13. Then, the first openings 110, which penetrate through the second adhesive layer 15 and the insulating base layer 11, are defined. The first conductive posts 111 are formed in the first openings 110. The structure of the second single-sided circuit substrate 30 obtained at this time is shown in FIG. 11.

The melting point of the second adhesive layer 15 is approximately similar to that of the first adhesive layer 40 (the difference therebetween does not exceed 30 Celsius degrees).

In step S6 of fabricating the third single-sided circuit substrate 50 by the second single-sided circuit substrate 30, the third single-sided circuit substrate 50 also includes the second adhesive layer 15 as shown in FIG. 9.

In step S10, as shown in FIG. 10, the intermediate body 70 is pressed at the pressing temperature higher than the melting points of the first adhesive layer 40 and the second adhesive layer 15. Since the melting point of the first adhesive layer 40 is close to that of the second adhesive layer 15, only one pressing step is required, which can cause the first adhesive layer 40 to infill the gap of the circuit layers 13 and the second adhesive layer 15 to infill the gap between the receiving groove 31 and the electronic component 14. Then, the circuit board 200 is obtained.

Referring to FIG. 8, a first embodiment of the present disclosure also provides a circuit board 100. The circuit board 100 includes a first single-sided circuit substrate 20, a first adhesive layer 40, a second single-sided circuit substrate 30, at least one third is single-sided circuit substrate 50, and a surface mounted circuit substrate 60 stacked in that order.

The first single-sided circuit substrate 20 includes an insulating base layer 11 and a circuit layer 13 disposed on the insulating base layer 11.

The second single-sided circuit substrate 30 includes another first single-sided circuit substrate 20 and a number of first conductive posts 111 disposed in the insulating base layer 11 and electrically connected to the circuit layer 13.

A number of second conductive posts 401 are disposed in the first adhesive layer 40.

The third single-sided circuit substrate 50 includes another second single-sided circuit substrate 30 and a receiving groove 31 defined in the second single-sided circuit substrate 30.

The surface mounted circuit substrate 60 includes another first single-sided circuit substrate 20 and an electronic component 14 mounted on the circuit layer 13. The first single-sided circuit substrate 20 and the insulating base layer 11 of the surface mounted circuit board 60 are both disposed at outermost of the circuit board 100.

The electronic component 14 is disposed in the receiving groove 31. The first conductive posts 111 and the second conductive posts 401 are electrically connected to both sides of the circuit layer 13. The first adhesive layer 40 infills the gap of the circuit layers 13, and the insulating base layer 11 infills the gap between the receiving groove 31 and the electronic component 14.

Referring to FIG. 10, a second embodiment of the present disclosure further provides a circuit board 200. Different from the circuit board 100, each of a second single-sided circuit substrate 30' and a third single-sided circuit substrate 50' of the circuit board 200 further includes a second adhesive layer 15. The second adhesive layer 15 is located on a surface of the insulating base layer 11 away from the circuit layer 13. The second adhesive layer 15 infills the gap between the receiving groove 31 and the electronic component 14.

Since the entire method of the present disclosure includes only one pressing process, the deformation of the circuit board caused by multiple pressing processes is reduced. The defect rate is also reduced, the method is simplified, and the cost is also reduced. Moreover, since no plated hole is included, which makes the method to be more environmentally friendly. Furthermore, since the insulating base layer is disposed at outermost of the circuit board, no additionally cover film is needed, and the method is further simplified.

Although the embodiments of the present disclosure have been shown and described, those having ordinary skill in the art can understand that changes may be made within the principles of the present disclosure, up to and including the full extent established by the broad general meaning of the terms used in the claims. It will, therefore, be appreciated that the embodiments described above may be modified within the scope of the claims.

What is claimed is:

1. A method for manufacturing a circuit board, comprising:
    providing a first single-sided circuit substrate, the first single-sided circuit substrate comprising an insulating base layer and a circuit layer disposed on the insulating base layer;
    providing one of the first single-sided circuit substrate, forming a plurality of first conductive posts electrically connected to the circuit layer in the insulating base layer, thereby obtaining a second single-sided circuit substrate;
    providing a first adhesive layer, forming a plurality of second conductive posts in the first adhesive layer;
    providing one of the second single-sided circuit substrate, defining a receiving groove penetrating the circuit layer and the insulating base layer of the second single-sided circuit substrate, thereby obtaining a third single-sided circuit substrate;
    providing another one of the first single-sided circuit substrate, and mounting an electronic component on the circuit layer, thereby obtaining a surface mounted circuit substrate;
    stacking the first single-sided circuit substrate, the first adhesive layer containing the plurality of second conductive posts, the second single-sided circuit substrate, at least one of the third single-sided circuit substrate, and the surface mounted circuit substrate in that order, causing the receiving groove to correspond to the electronic component, and causing the first single-sided circuit substrate and the insulating base layer of the surface mounted circuit substrate to both face outwards, thereby obtaining an intermediate body; and
    pressing the intermediate body, causing the plurality of first conductive posts and the plurality of second conductive posts to electrically connected to both sides of the circuit layer, thereby obtaining the circuit board.

2. The method of claim 1, wherein the insulating base layer is made of a thermoplastic polymer resin, the pressing is performed at a heating temperature, the pressing is configured to cause the first adhesive layer of the intermediate body to infill a gap of the circuit layer, and to cause the insulating base layer to infill a gap between the receiving groove and the electronic component.

3. The method of claim 2, wherein the electronic component is mounted on the circuit layer through a conductive layer, and a melting point of the conductive layer is higher than the heating temperature of the pressing.

4. The method of claim 1, wherein the insulating base layer is made of a non-thermoplastic polymer resin;
    wherein when forming the second single-sided circuit substrate, a second adhesive layer is first covered on a surface of the insulating base layer away from the circuit layer, and then the plurality of first conductive posts is formed, so that each of the second single-sided circuit substrate and the third single-sided circuit substrate further comprises the second adhesive layer;
    the pressing is performed at a heating temperature, the pressing is configured to cause the first adhesive layer to infill a gap of the circuit layer, and to cause the second adhesive layer to infill a gap between the receiving groove and the electronic component.

5. The method of claim 4, wherein a difference between a melting point of the second adhesive layer and a melting point of the first adhesive layer does not exceed 30 Celsius degrees.

6. The method of claim 1, wherein after the pressing, the method further comprises:
    defining a plurality of openings in each insulating base layer of the pressed intermediate body facing outwards, a portion of the circuit layer is exposed to the plurality of openings to form a plurality of solder pads; and
    performing a surface treatment on the plurality of solder pads.

7. The method of claim 1, wherein the plurality of first conductive posts is made of a copper paste.

8. The method of claim 1, wherein the plurality of second conductive posts is made of a metal conductive paste.

9. The method of claim 2, wherein the insulating base layer is made of at least one material selected from a group consisting of thermoplastic polyimide (TPI), polyethylene terephthalate (PET), polyethylene naphthalate (PEN), Ajinomoto Build-up Film (ABF), and bismaleimide triazine (BT).

10. The method of claim 4, wherein the insulating base layer is made of liquid crystal polymer (LCP).

* * * * *